(12) United States Patent
Usatyuk et al.

(10) Patent No.: US 11,057,049 B2
(45) Date of Patent: Jul. 6, 2021

(54) GENERALIZED LOW-DENSITY PARITY CHECK CODES IN DIGITAL COMMUNICATION SYSTEM

(71) Applicant: Huawei Technologies Co., Ltd., Shenzhen (CN)

(72) Inventors: Vasily Stanislavovich Usatyuk, Moscow (RU); Nikita Andreevich Polianskii, Moscow (RU); Ilya Viktorovich Vorobyev, Moscow (RU); Vladimir Anatolyevich Gaev, Moscow (RU); German Viktorovich Svistunov, Moscow (RU); Mikhail Sergeevich Kamenev, Moscow (RU); Yulia Borisovna Kameneva, Moscow (RU)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 16/738,768

(22) Filed: Jan. 9, 2020

(65) Prior Publication Data

US 2020/0220556 A1 Jul. 9, 2020

Related U.S. Application Data

(63) Continuation of application No. PCT/RU2017/000509, filed on Jul. 10, 2017.

(51) Int. Cl.
*H03M 13/11* (2006.01)
*H03M 13/25* (2006.01)
*H04L 1/18* (2006.01)

(52) U.S. Cl.
CPC ...... *H03M 13/116* (2013.01); *H03M 13/1154* (2013.01); *H03M 13/255* (2013.01); *H04L 1/1819* (2013.01)

(58) Field of Classification Search
CPC ... H04L 1/0041; H04L 1/0061; H04L 1/0067; H04L 1/1819; H03M 13/116; H03M 13/1154; H03M 13/255; H03M 13/1182
See application file for complete search history.

(56) References Cited

PUBLICATIONS

Chen et al., Two-dimensional generalized Reed-Solomon codes: A unified framework for quasi-cyclic LDPC codes construction based on finite fields, IEEE, p. 839 to 843. (Year: 2010).*
Gabidulin et al., Generalized construction of Quasi-cyclic regular LDPC codes based on permutation matrices, IEEE, pp. 678-683. (Year: 2006).*
Guneri et al., Structure and Performance of Generalized Quasi-Cyclic Codes, ArXiv,1702.00153v1 (retrieved from google.com) (Year: 2017).*
Smarandache et al, Quasi-cyclic LDPC codes: Influence of proto and tanner graph structure on minimum hamming distance upper bounds, IEEE, Trans. on Information Theory, vol. 58, No. 2, pp. 585-607 (Year: 2012).*

* cited by examiner

*Primary Examiner* — Shelly A Chase
(74) *Attorney, Agent, or Firm* — Leydig, Volt & Mayer, Ltd.

(57) ABSTRACT

Provided is an encoder, a decoder, a computer-readable medium and methods of forward error correction channel encoding/decoding within a HARQ scheme, based on a generalized quasi-cyclic low-density parity-check code comprising a Cordaro-Wagner component code.

12 Claims, 7 Drawing Sheets

Trapping sets: (a) $(5,3)$ and (b) $(4,4)$

- represents a variable node
- □ represents an even degree check node
- ■ represents an odd degree check node

Girth point of view

Target girth >=6 length cycle
Circulant 8

$$\begin{array}{cccccc} * & * & * & I_0 & 0 & I_1 \\ * & * & * & I_0 & I_0 & 0 \\ * & * & * & 0 & I_0 & I_0 \end{array} \quad \Downarrow$$

$$\begin{array}{cccccc} I_A & * & * & I_0 & 0 & I_1 \\ * & * & * & I_0 & I_0 & 0 \\ * & * & * & 0 & I_0 & I_0 \end{array}, A \neq \{0,1\}$$

$$\Downarrow$$

$$\begin{array}{cccccc} I_0 & * & * & I_0 & 0 & I_1 \\ I_B & * & * & I_0 & I_0 & 0 \\ * & * & * & 0 & I_0 & I_0 \end{array}, B \neq \{0,1\}$$

and so on for Girth>4

$$\begin{array}{cccccc} I_0 & * & * & I_0 & 0 & I_1 \\ I_6 & * & * & I_0 & I_0 & 0 \\ I_c & * & * & 0 & I_0 & I_0 \end{array}, \quad \begin{array}{c}(c-6+1-0) \bmod 8 \neq 0 \\ C \neq \{7,6\}\end{array}$$

$$\Downarrow$$

$$\begin{array}{cccccc} I_0 & I_D & * & I_0 & 0 & I_1 \\ I_6 & * & * & I_0 & I_0 & 0 \\ I_3 & * & * & 0 & I_0 & I_0 \end{array}, D \neq \{0\}$$

$$\Downarrow$$

$$\begin{array}{cccccc} I_0 & I_0 & * & I_0 & 0 & I_1 \\ I_6 & I_E & * & I_0 & I_0 & 0 \\ I_3 & * & * & 0 & I_0 & I_0 \end{array}, E \neq \{0,6\}$$

$$\vdots$$

$$\begin{array}{cccccc} I_0 & I_0 & I_0 & I_0 & 0 & I_1 \\ I_6 & I_7 & I_3 & I_0 & I_0 & 0 \\ I_3 & I_1 & I_8 & 0 & I_0 & I_0 \end{array}, J \neq \{3,0,1,5,7\}$$

GENERALIZED LOW-DENSITY PARITY CHECK CODES IN DIGITAL COMMUNICATION SYSTEM

CROSS-REFERENCE TO RELATED APPLICATIONS

This application claims is a continuation of International Application No. PCT/RU2017/000,509, filed on Jul. 10, 2017. the disclosure of which is hereby incorporated by reference in its entirety.

TECHNICAL FIELD

The present disclosure relates to Generalized Low-Density Parity-Check (GLDPC) codes for channel coding in digital communication systems. In particular, the present disclosure relates to GLDPC codes for Incremental Redundancy Hybrid Automatic Repeat Request (IR-HARQ) schemes.

BACKGROUND

FIG. 1 shows a block diagram illustrating a generic digital communications system 10 in which the elements of the present disclosure may be implemented. The system includes a transmitting side comprising a generic encoder 12 and a receiving side comprising a generic decoder 14. The input of the generic encoder 12 at the transmitting side may be an information sequence $IS_1$ of k bits to which a redundancy sequence of r bits is added in an encoding operation performed by the generic encoder 12, thereby producing an encoded information sequence $IS_2$ of k+r=n bits which may be forwarded to a modulator 16.

The modulator 16 may transform the encoded sequence $IS_2$ into a modulated signal vector CH_IN which is in turn transmitted through a channel 18 such as, for example, a radio channel or an optical channel. Since the channel 18 is usually subject to noisy disturbances, the channel output CH_OUT may differ from the channel input CH_IN.

At the receiving side, the channel output vector CH_OUT may be processed by a demodulator 20 which produces some likelihood ratio. The generic decoder 14 may use the redundancy in the received information sequence $IS_3$ in a decoding operation to correct errors in the received information sequence $IS_3$ and produce a decoded information sequence $IS_4$ which is an estimate of the information sequence $IS_2$ from which the information sequence $IS_1$ can be extracted.

The encoding operation and the decoding operation may be governed by an LDPC code. In the general formulation of channel coding, an LDPC code may employ a generator matrix G for the encoding operation in the generic encoder 12 and a parity-check matrix H for the decoding operation in the generic decoder 14.

For a LDPC code with an information sequence $IS_1$ of size 1×k, a code word $IS_2$ of size 1×n and a redundancy (parity) sequence of r=(n−k) bits, the generator matrix G has size k·n, and the parity-check matrix H has size r·n=(n−k)·n. The parity-check matrix $H_{r\times n}$ and the generator matrix $G_{k\times n}$ enjoy the orthogonality property, which states that for any generator matrix $G_{k\times n}$ with k linearly independent rows there exists a parity-check matrix $H_{r\times n}$ with r=(n−k) linearly independent rows. Thus, any row of the generator matrix $G_{k\times n}$ is orthogonal to the rows of the parity-check matrix $H_{r\times n}$ such that the following equation is satisfied:

$$G_{k\times n} \cdot H_{n\times r}^T = 0$$

The encoding operation can be performed by means of a multiplication between the information sequence $IS_1$ and the generator matrix $G_{k\times n}$, wherein the result of the multiplication provides the encoded output sequence $IS_2$ as follows:

$$IS_2 = IS_1 \cdot G_{k\times n}$$

At the receiving side, due to the orthogonality property between the generator matrix $G_{k\times n}$ and the parity-check matrix $H_{r\times n}$, the following equation should be satisfied:

$$H_{r\times n} = IS_4^T = 0$$

where $IS_4$ is the decoded received information sequence of size 1×n. If the above equation is verified, the information signal estimate $IS_4$ is correct.

Once the parity-check matrix $H_{r\times n}$ is generated, it is possible to obtain the generator matrix $G_{k\times n}$ and vice versa. Accordingly, any process of determining a parity-check matrix $H_{r\times n}$ may be mapped to an equivalent process of obtaining a generator matrix $G_{k\times n}$, so that any process disclosed throughout the description and claims in relation to determining a parity-check matrix $H_{r\times n}$ shall be understood as encompassing the equivalent process of obtaining a generator matrix $G_{k\times n}$ and vice versa.

A particular form of the parity-check matrix $H_{r\times n}$ is a regular quasi-cyclic (QC)-LDPC matrix $^{reg}H_{r\times n}^{QC}$ which can be divided into quadratic submatrices $I(b_{j,l})$, i.e. circulant matrices (or "circulants" for short), which may, for example, be obtained from cyclically right-shifting an N×N identity matrix I(0) by $b_{j,l}$ positions:

$$^{reg}H_{r\times n}^{QC} = \begin{bmatrix} I(b_{0,0}) & I(b_{0,1}) & \ldots & I(b_{0,L-1}) \\ I(b_{1,0}) & I(b_{1,1}) & & I(b_{1,L-1}) \\ M & M & O & M \\ I(b_{J-1,0}) & I(b_{J-1,1}) & \ldots & I(b_{J-1,L-1}) \end{bmatrix}$$

with N=n L (cf. M. P. C. Fossorier, "*Quasi-Cyclic Low-Density Parity-Check Codes from Circulant Permutation Matrices*", IEEE TRANSACTIONS ON INFORMATION THEORY, Volume 50, Issue 8, Pages 1788-1793, August 2004). Thus, a regular QC-LDPC matrix $^{reg}H_{r\times n}^{QC}$ may be defined by a base matrix B which satisfies:

$$B = \begin{bmatrix} b_{0,0} & b_{0,1} & \ldots & b_{0,L-1} \\ b_{1,0} & b_{1,1} & & b_{1,L-1} \\ M & M & O & M \\ b_{J-1,0} & b_{J-1,1} & \ldots & b_{J-1,L-1} \end{bmatrix}$$

Moreover, an irregular QC-LDPC matrix $^{irreg}H_{r\times n}^{QC}$ may be obtained by $^{irreg}H_{r\times n}^{QC} = {}^{reg}H_{r\times n}^{QC} \, o M_{mask}$ where "o" denotes the Hadamard product and $$M_{mask} = \begin{bmatrix} m_{0,0} & m_{0,1} & \ldots & m_{0,L-1} \\ m_{1,0} & m_{1,1} & & m_{1,L-1} \\ M & M & O & M \\ m_{J-1,0} & m_{J-1,1} & \ldots & m_{J-1,L-1} \end{bmatrix}$$

denotes a mask matrix with $m_{j,l} \in \{0,1\}$.

Thus, for employing a QC-LDPC code in the generic encoder 12 and the generic decoder 14, the generic encoder 12 and the generic decoder 14 may be provided with a circulant, shift values, i.e., values corresponding to the entries of the base matrix B, and (optionally) a mask matrix $M_{mask}$. For instance, an apparatus configured to choose shift values for determining a QC-LDPC matrix $H_{r \times n}^{QC}$ (or the corresponding generator matrix) may be integrated in (or connected to) the generic encoder 12 and/or the generic decoder 14. Moreover, the generic encoder 12 and the generic decoder 14 may also be provided with a mask matrix $M_{mask}$ to generate an irregular QC-LDPC matrix $^{irreg}H_{r \times n}^{QC}$.

Moreover, a QC-LDPC matrix $H^{QC}$ can be described by its equivalent bipartite graph ("Tanner graph"), wherein each edge of the Tanner graph connects one variable node of a plurality of variable nodes (which from the first set of the bipartite graph) to one check node of a plurality of check nodes (which form the second set of the bipartite graph). For example, a QC-LDPC matrix $H_{r \times n}^{QC}$ of r rows and n columns can be represented by its equivalent bipartite graph with r check nodes and n variable nodes which has edges between the check nodes and the variable nodes if there are corresponding "1s" in the QC-LDPC matrix $H_{r \times n}^{QC}$ (cf. R. Tanner, "*A Recursive Approach to Low Complexity Codes*", IEEE TRANSACTIONS IN INFORMATION THEORY, Volume 27, Issue 5, Pages 533-547, September 1981). Thus, the variable nodes represent code-word bits and the check nodes represent parity-check equations.

In the Tanner graph of an LDPC code, any degree-s check node may be interpreted as a length-s single parity-check code, i.e., as an (s, s–1) linear block code. Thus, for generalizing an LDPC code, check nodes of the LDPC code may be replaced with a linear block code to enhance the overall minimum distance (cf. M. Lentmaier et al., "*On Generalized Low-Density Parity-Check Codes based on Hamming Component Codes*", IEEE COMMUNICATIONS LETTERS, Volume 3, Issue 8, Pages 248-250, August 1999).

A finite set of connected edges in the Tanner graph, wherein the set starts and ends at the same node and satisfies the condition that no node (except the initial and final node) appears more than once forms a "cycle". The "length" of the cycle is the number of edges of the set. The "girth" of the Tanner graph (or "girth" in short) is the length of the shortest cycle(s) in the graph. In this regard, it is noted that short cycles in a Tanner graph of an LDPC code may prevent decoding algorithms from converging. Furthermore, short cycles may degrade the performance of the generic decoder 14, because they affect the independence of the extrinsic information exchanged in the iterative decoding. Accordingly, shift values are to be chosen that achieve a high girth of the Tanner graph representation of the respective LDPC matrix.

Moreover, a LDPC code may contain Trapping Sets (TSs). More particularly, a (a,b) TS contains b check nodes which have an odd number of connections to a variable nodes. Accordingly, when the a variable nodes are wrong, only the b check nodes will be unsatisfied which may lead to a high error floor, as a belief propagation algorithm employed in the decoder 14 may be "trapped" in a false minimum.

While the above approaches to channel coding such as generalized QC-LDPC block codes have proven to perform well for a wide variety of scenarios, the urge for higher data throughput requires even more sophisticated solutions that achieve high data throughput with decent encoding/decoding resources. It is thus an object of embodiments of the present invention to provide for a more efficient forward error correction channel coding technique applicable to the generic digital communications system 10.

SUMMARY

According to a first aspect of embodiments of the present invention, there is provided an encoder for forward error correction channel encoding, the encoder configured to determine a protomatrix of a low-density parity check, LDPC, code for a hybrid automatic repeat request, HARQ, scheme, the protomatrix being representable by a sub-matrix formed by intersecting first rows and first columns, and second rows and second columns, wherein a number of the second columns is two times a number of the second rows, lift the protomatrix to determine a parity check matrix of a QC-LDPC code, replace rows of the parity check matrix with row sets (e.g., row pairs) of a component code (e.g., Cordaro-Wagner) to derive a generalized QC-LDPC code, provide a codeword having data bits and parity bits, based on the data bits and rows and columns of the generalized QC-LDPC code corresponding to the first rows and first columns, and provide additional parity bits, based on the codeword and rows and/or columns of the generalized QC-LDPC code.

In this regard, it is noted that the term "matrix" as used throughout the description and claims in particular refers to a set of (integer) values stored in a (logical) memory array or having assigned row and column indices. If not involving matrix algebra, or if respective matrix algebra routines are suitably redefined, the notion of rows and columns may even be changed or freely chosen. However, throughout the description and claims it is adhered to the mathematical concepts and notations regularly used in the art and they shall be understood as encompassing equivalent mathematical concepts and notations.

Moreover, the term "protomatrix" as used throughout the description and claims in particular refers to a matrix which determines the structure of the parity check matrix of the QC-LDPC code by indicating which blocks of the parity check matrix are to correspond to a zero matrix. In addition, the term "lifting" as used throughout the description and claims in particular refers to the process of determining entries in blocks of the parity check matrix that do not correspond to a zero matrix, but to a circulant matrix. In this regard, the term "circulant matrix" as used throughout the description and claims particularly refers to a matrix, e.g., the identity matrix, where each row vector is shifted one element to the right/left relative to the preceding row vector.

In a first example implementation form of the encoder according to the first aspect, wherein a matrix formed by an intersection of rows and columns of a parity check matrix of the generalized QC-LDPC code, which correspond to the second rows and columns, has a triangular structure.

Accordingly, the generalized QC-LDPC code may be provided with an easy encoding structure.

In a second example implementation form of the encoder according to the first aspect, to lift the protomatrix to determine the parity check matrix of the QC-LDPC code comprises to determine multiple possible shift values for entries of a base matrix of the QC-LDPC code, wherein the entries correspond to edges of a protograph corresponding to the protomatrix, and to iteratively select shift values for the entries, wherein a selection probability of a shift value is based on a measure of girth of the QC-LDPC code.

Hence, QC-LDPC codes having a higher girth may be promoted over QC-LDPC codes having a lower girth.

In a third example implementation form of the encoder according to the first aspect, the selection probability of a shift value which results in a larger girth than another shift value, is iteratively decreased.

Thus, the selection of shift values may be optimized using a simulated annealing algorithm.

In a fourth example implementation form of the encoder according to the first aspect, a selection probability of a shift value of multiple shift values achieving a same girth is to be larger, if the shift value achieves a higher extrinsic message degree, EMD, or a higher approximated cycle EMD, ACE, of a smallest cycle generated by the shift value.

Hence, a metric for the extrinsic message degree may be optimized during selection.

In a fifth example implementation form of the encoder according to the first aspect, the encoder is to repeat the acts of determining and lifting for multiple protomatrices which differ in regard to the second rows and columns, and to lift the protomatrix to determine the parity check matrix of the QC-LDPC code by selecting the protomatrix of the multiple protomatrices based on a performance measure.

By this, code quality of a code candidate to be chosen from a plurality of code candidates may be ensured.

According to a second aspect of embodiments of the present invention, there is provided a decoder for forward error correction channel decoding, the decoder configured to receive data including reliability values of a bit sequence of data bits and parity bits, wherein the bit sequence is to represent a codeword of a codebook, decode the data bits by passing messages between Cordaro-Wagner component code decoding units, wherein the messages are based on the reliability values and the passing is governed by subrows and subcolumns of a protomatrix of a low-density parity check, LDPC, code for a hybrid automatic repeat request, HARQ, scheme, the protomatrix being represented by the subrows and subcolumns and second rows and second columns, wherein a number of the second columns is two times a number of the second rows, transmit a HARQ message in relation to the codeword, if the decoder determines that one or more data bits have not been decoded correctly, wherein the HARQ message is to demand a provision of additional parity bits for the data bits, receive further data including further reliability values of a bit sequence comprising the additional parity bits, and decode the one or more data bits that have not been decoded correctly by passing further messages between the Cordaro-Wagner component code decoding units, wherein the further messages are based, at least in part, on the further reliability values, and the passing of the further messages is governed by the subrows and the subcolumns of the protomatrix and one or more of the second rows and/or columns.

In this regard, it is noted that the term "reliability value" as used throughout the description and claims in particular refers to a likelihood, likelihood ratio, or log likelihood ratio. Moreover, the term "message" as used throughout the description and claims in particular refers to a data structure comprising an estimate calculated by carrying-out a belief propagation algorithm.

In a first example implementation form of the decoder according to the second aspect, a decoding unit is to operate on two parity check equations.

According to a second aspect of embodiments of the present invention, there is provided a system for forward error correction channel encoding comprising the encoder and the decoder.

According to a third aspect of embodiments of the present invention, there is provided a computer-readable medium storing a rate-adaptive generalized quasi-cyclic low-density parity check, QC-LDPC code, the generalized QC-LDPC code being representable by a protomatrix which is dividable into a submatrix corresponding to a first rate, the submatrix being formed by an intersection of first rows and first columns, and second rows and second columns corresponding to one or more second rates, wherein a number of the second columns is two times a number of the second rows and component codes (e.g., Cordaro-Wagner component codes) mapped to the rows of the protomatrix, wherein a component code is representable by a check matrix having multiple (e.g., two) rows.

According to a fourth aspect of embodiments of the present invention, there is provided a method of forward error correction channel encoding, comprising determining a protomatrix of a low-density parity check, LDPC, code for a hybrid automatic repeat request, HARQ, scheme, the protomatrix being representable by a sub-matrix formed by an intersection of first rows and first columns, and second rows and second columns, wherein a number of the second columns is two times a number of the second rows, lifting the protomatrix to determine a parity check matrix of a QC-LDPC code, replacing rows of the parity check matrix with row pairs of a component code (e.g., a Cordaro-Wagner component code) to derive a generalized quasi-cyclic LDPC, QC-LDPC, code, providing a codeword having data bits and parity bits, based on the data bits and rows and columns of the generalized QC-LDPC code corresponding to the first rows and first columns, and providing additional parity bits based on the codeword and rows and/or columns of the generalized QC-LDPC code.

In a first example implementation form of the method according to the fourth aspect, a matrix formed by an intersection of rows and columns of a parity check matrix of the generalized QC-LDPC code, which correspond to the second rows and columns, has a triangular structure.

Accordingly, the GLDPC code may be provided with an easy-encoding structure.

In a second example implementation form of the method according to the fourth aspect, lifting the protomatrix to determine the parity check matrix of the QC-LDPC code comprises determining multiple possible shift values for entries of a base matrix of the QC-LDPC code, wherein the entries correspond to edges of a protograph corresponding to the protomatrix, and iteratively selecting shift values for the entries, wherein a selection probability of a shift value is calculated based on a measure of girth of the QC-LDPC code.

Hence, QC-LDPC codes having a higher girth may be promoted over QC-LDPC codes having a lower girth.

In a third example implementation form of the method according to the fourth aspect, the selection probability of a shift value resulting in a larger girth than another shift value is iteratively decreased.

Thus, the selection of shift values may be optimized using a simulated annealing algorithm.

In a fourth example implementation form of the method according to the fourth aspect, the steps of determining and lifting are repeated for multiple protomatrices which differ in regard to the second rows and columns, and lifting the protomatrix to determine the parity check matrix of the QC-LDPC code comprises selecting the protomatrix of the multiple protomatrices based on a performance measure.

By this, code quality of a code candidate to be chosen from a plurality of code candidates may be ensured.

According to a fifth aspect of embodiments of the present invention, there is provided a method of forward error correction channel decoding, comprising receiving data including reliability values of a bit sequence of data bits and parity bits, wherein the bit sequence is to represent a codeword of a codebook, decoding the data bits by passing messages between Cordaro-Wagner component code decoding units, wherein the messages are based on the reliability values and the passing is governed by subrows and subcolumns of a protomatrix of a low-density parity check, LDPC, code for a hybrid automatic repeat request, HARQ, scheme, the protomatrix being represented by the subrows and subcolumns and second rows and second columns, wherein a number of the second columns is two times a number of the second rows, transmitting a HARQ message in relation to the codeword, if one or more data bits have not been decoded correctly, wherein the HARQ message is to demand a provision of additional parity bits for the data bits, receiving further data including further reliability values of a bit sequence comprising the additional parity bits, and decoding the one or more data bits that have not been decoded correctly by passing further messages between the Cordaro-Wagner component code decoding units, wherein the further messages are based, at least in part, on the further reliability values, and the passing of the further messages is governed by the subrows and the subcolumns of the protomatrix and one or more of the second rows and/or columns.

BRIEF DESCRIPTION OF THE DRAWINGS

FIGS. 8 and 9 illustrate a procedure for lifting a protomatrix.

FIG. 10 shows an example of a lifted family of nested QC-LDPC codes.

DETAILED DESCRIPTION

The following provides a non-limiting example of a process of generating a GLDPC parity-check matrix for deriving a family of GLDPC codes to be used in a HARQ scheme. The process may be implemented by hardware, software, or a combination of hardware and software. For example, the process of generating a GLDPC parity-check matrix for deriving a family of GLDPC codes as well as procedures involving the usage of the family of codes such as encoding/decoding a sequence of information bits may be automatically carried-out by the encoder 12, the decoder 14, or a machine comprising a processor which carries out machine-readable instructions persistently stored on a machine-readable medium.

Figure 1:
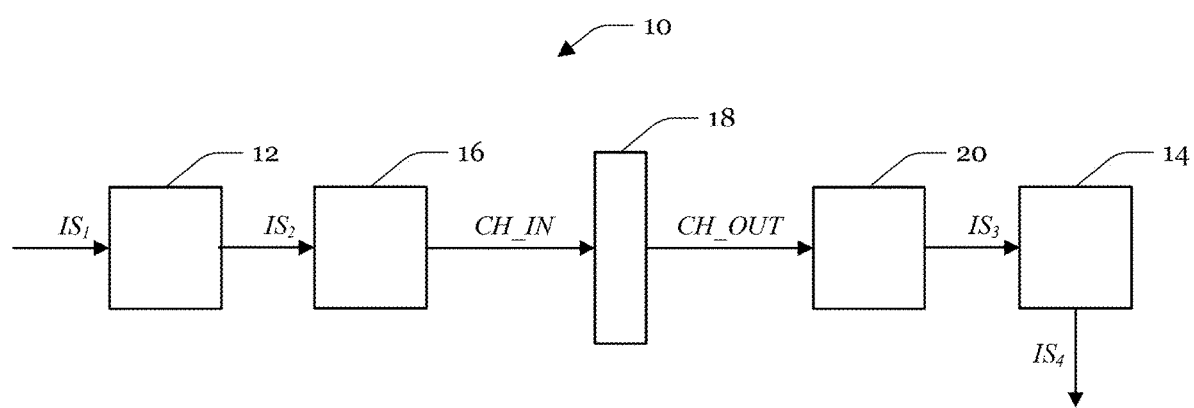
FIG. 1 is a block diagram illustrating a generic digital communications system in which the elements of the present disclosure may be implemented.
Figure 2:
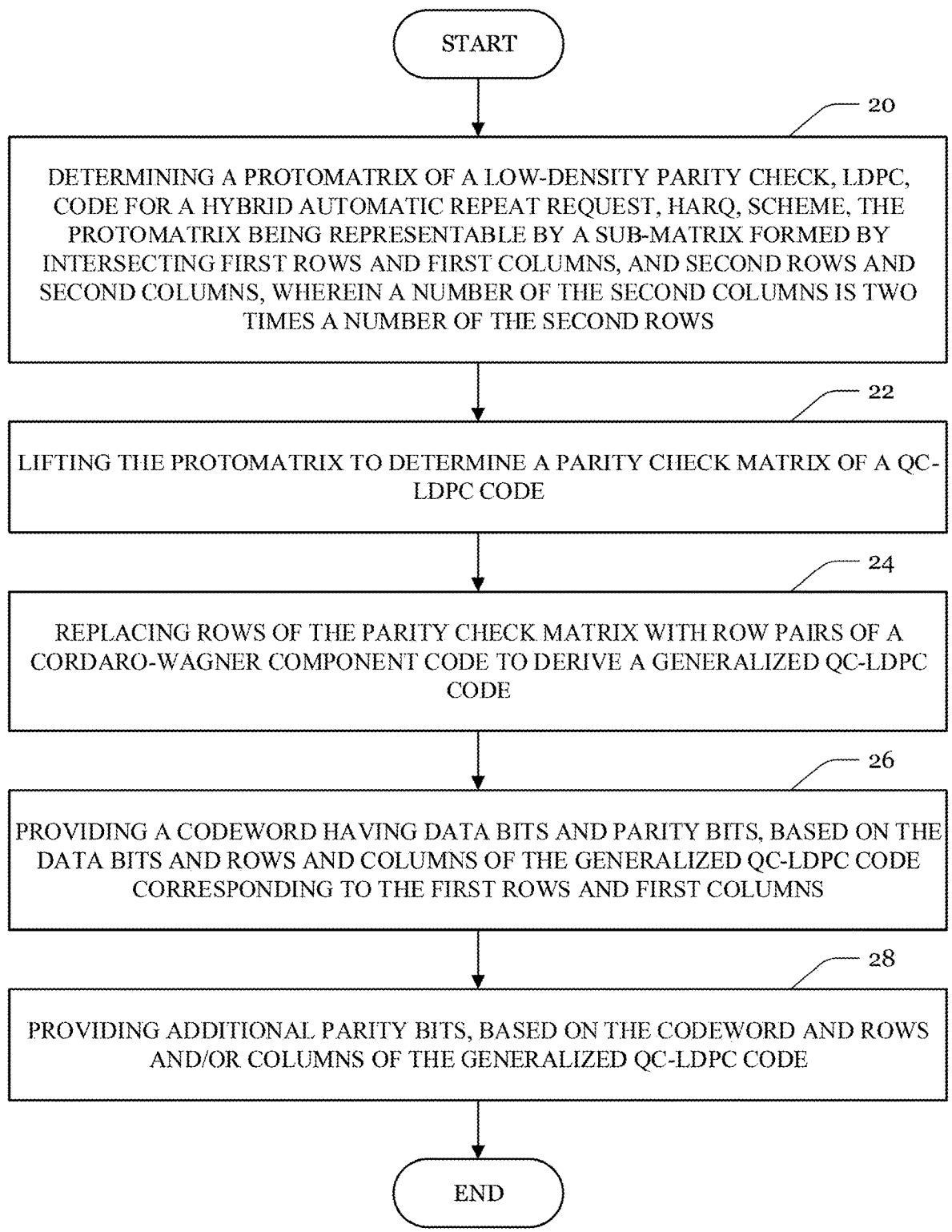
FIG. 2 is a flow-chart of a procedure for forward error correction channel encoding.
Figure 3:
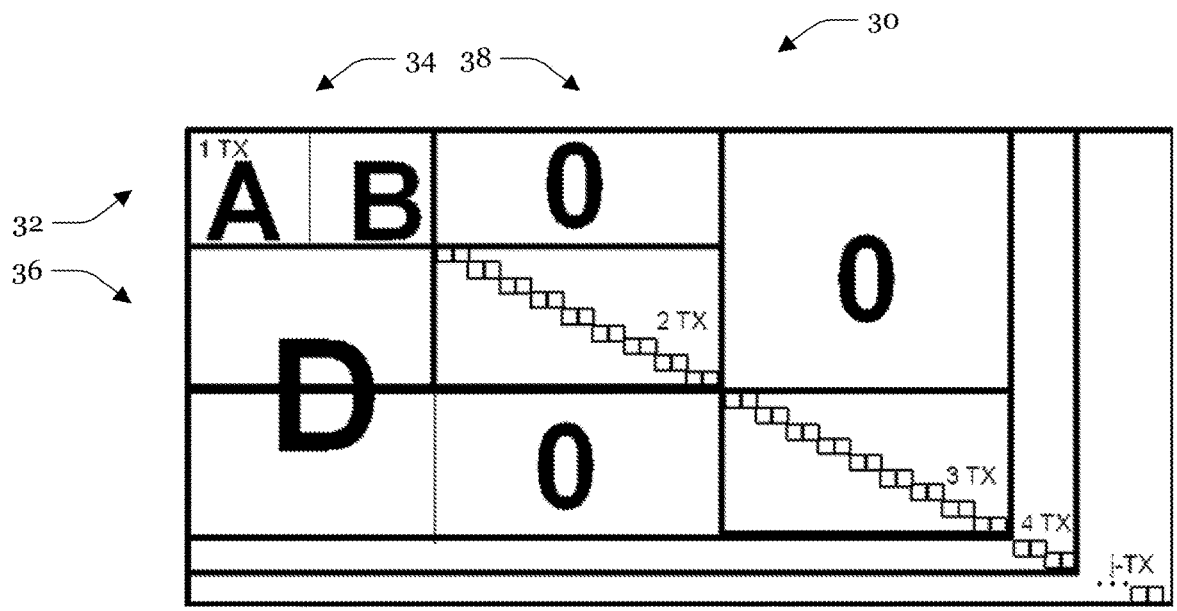
FIG. 3 illustrates a protomatrix structure of a of a low-density parity check, LDPC, code.

As shown in FIG. 2, the process of generating a GLDPC parity-check matrix may start with a step 20 of determining a protomatrix of a low-density parity check, LDPC, code. As shown in FIG. 3, the protomatrix 30 may be represented by a sub-matrix (which is also referred to as the "high rate/core protomatrix" in the following) comprising an information part A and a parity part B which are formed by intersecting first rows 32 and first columns 34, and second rows 36 and second columns 38.

The parity part B of the core protomatrix may be chosen for the GLDPC code to have an "easy-encoding structure" that allows an efficient calculation of the parity bits, i.e., the core protomatrix may be chosen for the corresponding GLDPC code to be designed as an IRA/eIRA LDPC code (cf. M. Yang, W. E. Ryan, and Y. Li, "Design of efficiently encodable moderate-length high-rate irregular LDPC codes," IEEE TRANS. COMMUN., vol. 52, no. 4, pp. 564-571, April 2004.)

$$\begin{matrix} 0 & 0 & -1 & -1 & -1 & -1 & -1 \\ -1 & 0 & 0 & -1 & -1 & -1 & -1 \\ M & K & K & K & K & K & K \\ C & -1 & -1 & 0 & 0 & -1 & -1 \\ M & -1 & -1 & -1 & 0 & 0 & -1 \\ -1 & -1 & -1 & -1 & -1 & 0 & 0 \\ 0 & -1 & -1 & -1 & -1 & -1 & 0 \\ \\ C & 0 & -1 & -1 & -1 & -1 & -1 \\ -1 & 0 & 0 & -1 & -1 & -1 & -1 \\ M & K & K & K & K & K & K \\ 0 & -1 & -1 & 0 & 0 & -1 & -1 \\ M & -1 & -1 & -1 & 0 & 0 & -1 \\ -1 & -1 & -1 & -1 & -1 & 0 & 0 \\ C & -1 & -1 & -1 & -1 & -1 & 0 \end{matrix}$$

where "-1" indicates the zero matrix, "0" indicates the identity matrix, and C indicates another circulant.

The second columns 38 correspond to additional parity bits and the ratio of the number of second columns 38 and the number of second rows 36 may equal a pre-determined factor (which happens to be two in FIG. 3), to allow for replacing a single row of the resulting LDPC code with multiple rows of a component code, wherein the pre-determined factor may equal the number of rows of the component code, on the basis of which the GLDPC code is generated. The rate of a GLDPC code (comprising a 2-row component code) may be equal to $$R = \frac{VN - 2 \times CN}{VN - PN},$$

where VN is the number of variable nodes, CN is the number of check nodes, and PN is the number of punctured VNs.

To allow for an "easy-encoding structure" (e.g., IRA/eIRA) for the additional parity bits, the second rows 36 of the protomatrix 30 may be designed to allow for a triangular form of the GLDPC code to be generated, by having two (i.e. the pre-determined factor) consecutive entries to be labelled (with an entry that does not correspond to a zero matrix), wherein each two consecutive entries do not overlap column-wise (i.e. in the vertical direction) with the two consecutive entries in the preceding and succeeding second row 36.

The protomatrix 30 may be iteratively generated starting from the core protomatrix in accordance with a maximum number of i IR-HARQ transmissions (TX) such that, as indicated in FIG. 3, the protomatrix 30 may comprise a set of i nested protomatrices $P_1, \ldots, P_K$, wherein each nested protomatrix $P_1, \ldots, P_K$ corresponds to a transmission according to a HARQ protocol. For example, $P_2$ may be generated from $P_1$ by adding an extension of one row and two columns:

| | | | | | | | | | | | | | | | | | | | | | | | | |
|---|---|---|---|---|---|---|---|---|---|---|---|---|---|---|---|---|---|---|---|---|---|---|---|---|
| 1 | 1 | 1 | 1 | 1 | 0 | 0 | 1 | 0 | 1 | 1 | 0 | 1 | 1 | 1 | 1 | 1 | 0 | 1 | 1 | 1 | 1 | | 0 | 0 |
| 1 | 0 | 0 | 1 | 1 | 1 | 1 | 0 | 0 | 1 | 0 | 1 | 1 | 1 | 0 | 1 | 1 | 1 | 0 | 1 | 0 | 1 | | 0 | 0 |
| 1 | 1 | 1 | 1 | 0 | 1 | 0 | 1 | 1 | 0 | 1 | 1 | 0 | 1 | 1 | 1 | 1 | 1 | 1 | 1 | 1 | 1 | | 0 | 0 |
| 0 | 0 | 1 | 1 | 0 | 0 | 1 | 0 | 1 | 0 | 0 | 0 | 0 | 0 | 0 | 1 | 0 | 0 | 0 | 0 | 0 | 0 | | 1 | 1 |

Figure 4:
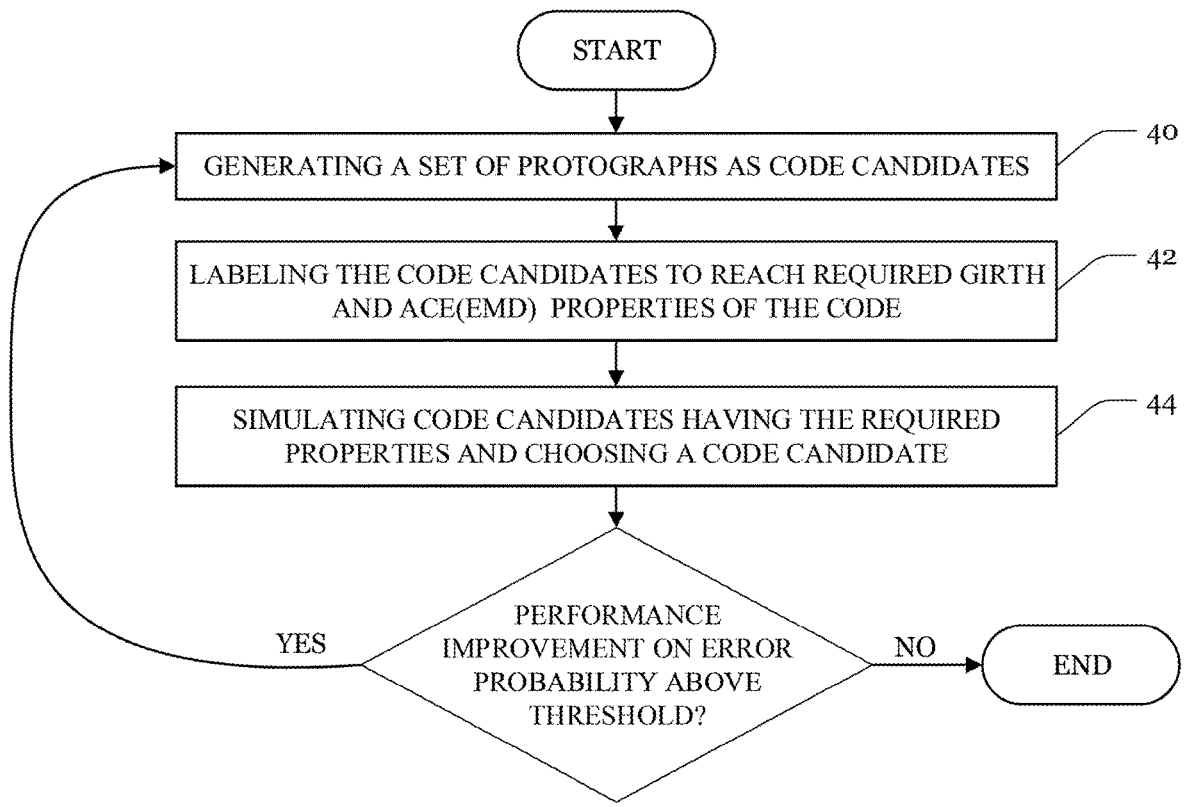
FIG. 4 is a flow-chart of a procedure for optimizing/choosing between code candidates.

FIG. 4 shows steps of a process for choosing an extension. After a step 40 of generating a set of protographs as code candidates, a multi-stage sieving algorithm may be performed at step 42. After sieving, a selection may be performed among the "remaining" code candidates based on a (performance) simulation at step 44. The process may be reiterated in form of a simulated annealing algorithm, to optimize the code and prevent an early termination on a local minimum. E. g., a protograph may be determined based on multi-dimensional density evolution (or protograph-exit chart to achieve a faster search) and after labeling, a simulated annealing optimization of the ACE spectrum may be performed, followed by sieving code candidates based on a simulation of code performance. Implementation examples for the steps of the process are provided in the following.

For each weight distribution value $\lambda_d$ (where $\lambda_d$ may, for example, be the fraction of ones in the columns in the protomatrix with d ones in the column) a set of all possible columns which achieves a required rate may be generated. Parallel edges in the protograph may be allowed, i.e. a cell in the protomatrix may not only be 0 or 1, but have a bigger value. For a desired size of a base matrix, an optimal density of parity checks may be chosen.

Based on these protographs $P_i$, parity check matrices $H(P_i)$ may be constructed by lifting while observing constrains on the graph properties.

Density Evolution and Multi-Dimensional Density Evolution

A photograph with minimal threshold may be determined using density evolution. Multi-Dimensional Density Evolution may allow considering weight one nodes and parallel edges in a protograph which may improve performance of the code. Density evolution is based on statistical considerations about the fraction of edges that connect to variable and check nodes. More precisely, there are two polynomials $$\lambda(x) = \sum_i \lambda_i x^{i-1}, \ p(x) = \sum_i p_i x^{i-1},$$

where $\lambda$ is a fraction of edges that connect to variables node of degree i and $p_i$ is a fraction of edges that connect to a check node of degree i with $$\sum_i \lambda_i = 1, \ \sum_i p_i = 1.$$

The average variable and check node degree may be expressed as $$l_{avg} = \frac{1}{\sum_i (\lambda_i/i)}, \ r_{avg} = \frac{1}{\sum_i (p_i/i)}$$

and the code rate may be defined as $$r = 1 - \frac{l_{avg}}{r_{avg}}.$$

For $n \to \infty$, the graph becomes a computational tree. Then, with probability $\lambda_i$, a variable node has exactly i neighbors and consequently the variable node has one parent and i−1 child nodes. Each child of the variable node is a check node which in turn with probability $p_i$ has i−1 neighbors as its own children. In this case, codes become completely defined from a statistical point of view.

Consider a check node c of this computational tree. Without constraints, it can be assumed that its degree is at least 2, i≥2. Thus, a check node c has a variable node v as a parent node and it has i−1 variable nodes $v_s$, $s \in i, \ldots, i-1$ as child nodes. Let $\gamma_s$ be a log-likelihood ratio which is a bit estimate known to a node $v_s$ in advance. In this case $\gamma_s$ are independent estimates. During belief propagation, the check node c may receive estimates $\gamma_s$ as message from its child nodes. Due to the fact that the check node c corresponds to a parity-check equation involving the later, the estimations from all bits which participate in this equation except one which corresponds to the parent node are obtained by the check node c. Check node c may process the information from child nodes and may estimate the value of the parent bit as $$m_{cv} = 2 \tanh^{-1}\left[\prod_{s=1}^{i-1} \tanh(\gamma_s)\right],$$

and the $m_{cv}$ may then be sent as new estimates to the parent node v.

Independent random variables $\gamma_s$ with a density function $f$ may have a probability of $\gamma_s$ to be between a and b which is given by $$P(a < \gamma_s < b) = \int_a^b f(x)dx,$$

in which case $m_{cv}$ may also be a random variable. The density function $f_{cv}$ of $m_{cv}$ may be equal to $$f_{cv} = \sum_{i=2}^{i_{max}} p_i f^{(i-1)\otimes},$$

where $f^{(i-1)\otimes}$ is a D-dimensional convolution.

A variable node of degree i which belongs to the computational tree may obtain messages from its children check nodes which are log-likelihood estimates generated by a check node and make a decision. This estimate may be denoted by $\delta_s$. If all messages are statistically independent, a bit estimate δ generated by this variable node is the sum $$\delta = \sum_{s=1}^{i-1} \delta_s - \delta_0,$$

where $\delta_0$ is an initial channel estimate. The density evolution method implies that the $\delta_s$ have the same density function $f$. Thus, for the $\delta$ density function $f_{cv} = f \times f \times \ldots \times f \times f_0 = f^{(i-1)\times} \times f_0$, with × indicating a convolution of density functions.

The variable node degrees of a computational tree may be random integers associated with degree distribution $$\lambda \ f_{cv} = \left( \sum_{i=2}^{i_{max}} \lambda_i f^{(i-1)\times} \right) \times f_0.$$

If using Cordaro-Wagner check nodes, the density function could be estimated as in: M. Lentmaier, M. B. S. Tavares and G. P. Fettweis, "*Exact erasure channel density evolution for protograph-based generalized LDPC codes,*" 2009 IEEE INTERNATIONAL SYMPOSIUM ON INFORMATION THEORY, Seoul, 2009, pp. 566-570.

The probability of erroneous estimate may be $$P_e = \int_{-\infty}^{0} f_{vc}(x) dx.$$

Density Evolution:

Let $f_0$ be a density function of initial log-likehood estimates, $I_\lambda$ be the maximum degree of variable nodes, and $I_p$ be the maximum degree of check nodes:

---

1. $f_{cv} = f_0$
2. For i

3. $f_{cv} = \sum_{i=2}^{i_{max}} p_i f^{(i-1)\otimes}$

4. $f_{cv} = \left( \sum_{i=2}^{i_{max}} \lambda_i f^{(i-1)\times} \right) \times f_0.$ 5. If $P_e = \int_{-\infty}^{0} f_{vc}(x) dx < \varepsilon$ then break 6. End For

---

If, for any value ε, there exist i such that after i iterations $P_e$ is less than ε, it may be said that the density evolution method converges.

A code with a degree distribution (λ, p) may be regarded as optimal code if it has a decoding (belief propagation) threshold $\sigma_+$:

$$(\lambda, p) = \underset{\tilde{\lambda}, \tilde{p}}{\operatorname{argmax}} \ \sigma_+(\tilde{\lambda}, \tilde{p}).$$

Moreover, a differential evolution method may be implemented (cf. Differential Evolution (DE) for Continuous Function Optimization (an algorithm by Kenneth Price and Rainer Stom) http://wwwl.icsi.berkeley.edu/~storn/code.html). The method may start with a certain noise level σ. For the first generation G=0, NP degree distributions (λ, p), s=1, ..., NP (called a list of distributions in the following) may be randomly chosen.

1. Initialization: For each distribution, k steps of the density evolution method may be run and its residual error $P_e$ may be recorded. The distribution with the smallest $P_e$ may be labelled as the best distribution ($\lambda_{best}$, $p_{best}$)
2. For the generation, G+1 new distributions may be generated according to the following scheme. For each s=1, ..., NP 4 distributions may be randomly chosen from the list with numbers $s_1$, $s_2$, $s_3$, $s_4$, $1 \le s_i \le NP$ and $s_i \ne s$. New ($\lambda_s$, $p_s$) may be defined as $\lambda_s = \lambda_{best} + F(\lambda_{s_1} - \lambda_{s_2} + \lambda_{s_3} - \lambda_{s_4})$, and $p_s = p_{best} + F(p_{s_1} - p_{s_2} + p_{s_3} - p_{s_4})$, where F is a real constant.
3. Selection scheme: For each distribution, i steps of the density evolution method may be run and its residual error $P_e$ may be recorded. The distribution with the smallest $P_e$ may be labelled as the best distribution ($\lambda_{best}$, $p_{best}$).
4. Stopping criteria: If $P_{best}$ is not small enough, it may be returned to step 2. Otherwise, σ may be increased slightly and it may be returned to step 1.

Density evolution may be challenging in view of computation complexity and the fact that with large rate code $$r = 1 - \frac{l_{avg}}{r_{avg}} > 0.7$$

polynomials have large degrees which may slow down convergence. When using a Multi-Edge approach (involving puncturing of high degree variable nodes, not to be confused with precoding which puncture middle or even low degree nodes) for QC GLDPC, the challenges may be reduced. For improving the threshold estimation, the use of the average value in the density-function may consider the propagation of the message on a decoding tree, specified by the protograph of the ensemble, multidimension Density Evolution (cf. T. Richardson, "*Multi-Edge Type LDPC Codes,*" presented at the WORKSHOP HONORING PROF. BOB MCELIECE ON HIS 60TH BIRTHDAY (but not included in the proceedings), California Institute of Technology, Pasadena, Calif., May 24-25, 2002, http://wiiau4.free.fr/pdf/Multi-Edge%20Type%20LDPC%20Codes.pdf) or Covariance evolution (cf. Amraoui, A., Montanari, A. and Urbanke, R. (2007), "*How to find good finite-length codes: from art towards science,*" EUR. TRANS. TELECOMM., 18: 491-508). In the case of convolutional GLDPC, threshold estimate may be performed as in M. Lentmaier and G. P. Fettweis, "*On the thresholds of generalized LDPC convolutional codes based on protographs,*" 2010 IEEE INTER- NATIONAL SYMPOSIUM ON INFORMATION THEORY, Austin, Tex., 2010, pp. 709-713. For further details see Richardson, T., Shokrollahi, A., Urbanke, R., "Design of provably good low-density parity check codes," INFORMATION THEORY, 2000. PROCEEDINGS. IEEE INTERNATIONAL SYMPOSIUM ON, vol., no., pp. 199, 2000 and Richardson, T. J., Urbanke, R. L., "The capacity of low-density parity-check codes under message-passing decoding," INFORMATION THEORY, IEEE TRANSACTIONS ON, vol. 47, no. 2, pp. 599-618, February 2000.

EXIT Chart and PEXIT Chart

An EXIT chart may be considered to be a special form of a capacity approximation of an iterative soft decoding method under some structural specified infinite length code which allows for a fast evaluation approximation of the density evolution. The infinite length basic assumption is the reason why the method neglects graph properties (which is the same for density evolution). Hence, it may benefit from sieving code candidates derivable from the protomatrix by labeling and simulation, because some protographs may not be liftable with the required length. Moreover, protograph thresholds may be wrong due to the numerical solution in combination with special types of protographs.

For a given protograph, an assumption of non-existence of cycles and hence a Gaussian distribution for LLR in the belief propagation algorithm may be made. After that, a decoding threshold of an ensemble of protographs characterized by given variable and check nodes distributions may be calculated.

The growth of information obtained by a belief propagation algorithm may be shown by a step function. If EXIT functions are not intersecting—the belief propagation algorithm can be finished. If the decoding threshold is the value of the noise, then two EXIT functions touch each other.

$$I_{E,V} = J(\sigma) = J\left(\sqrt{(d_v - 1)\sigma_A^2 + \sigma_{ch}^2}\right)$$

$$J(\sigma) = 1 - \int_{-\infty}^{\infty} \frac{1}{\sqrt{2\pi}\,\sigma} e^{-\left(l - \frac{\sigma^2}{2}\right)^2 / 2\sigma^2} \log(1 + e^{-l}) dl$$

$$I_{A,V} = J(\sigma_A)$$

$$I_{E,V} = J(\sigma) = J\left(\sqrt{(d_v - 1)[J^{-1}(I_{A,V})]^2 + \sigma_{ch}^2}\right)$$

The following approximation may be used for $I_{E,C}$:

$$I_{E,C} = 1 - J(\sqrt{(d_c - 1)[J^{-1}(1 - I_{A,C})]^2})$$

For irregular LDPC codes, $I_{E,V}$ and $I_{E,C}$ may be calculated as weighted averages. The weighting may be given by coefficients of the edge degree distribution polynomials $\lambda(z) = \sum_{d=1}^{d_v} \lambda_d z^{d-1}$ and $\rho(z) = \sum_{d=1}^{d_c} \rho_d z^{d-1}$, where $\lambda_d$ may be the fraction of ones in the columns in the protograph with d ones in the column, and $\rho_d$ may be the fraction of ones in the rows in the protograph with d ones in the row.

For irregular LDPC codes, this may result in $$I_{E,V} = \sum_{d=1}^{d_v} \lambda_d I_{E,V}(d, I_{A,V})$$

$$I_{E,C} = \sum_{d=1}^{d_v} \rho_d I_{E,C}(d, I_{A,C})$$

For example, a pre-calculated approximation function $J(\bullet)$ with accuracy 1e-5 may be used. After $I_{E,V}(d, I_{A,V})$ and $I_{E,C}(d, I_{A,C})$ are obtained, calculating the iterations may be started $$I_{A,V}^{(0)} = 0$$

$$I_{A,V}^{(n+1)} = I_{E,C}(d, I_{E,V}(d, I_{A,V}^{(n)}))$$

and stopped when $I_{A,V}^{(n)}$ is close to 1. For each distribution of weights $\lambda_d$, $\rho_d$ a minimal $$\frac{E_b}{N_0}$$

(based on $\sigma_A^2$) may be calculated when the iteration converges to 1 for fixed number of steps.

Using EXIT charts, relatively good distributions $\lambda_d$, $\rho_d$ and protomatrices with given distributions of ones in rows and columns may be generated. For improving the threshold estimation, an average value in the mutual information estimation $I_{E,V}$, $I_{E,C}$ may consider the propagation of the message in a decoding tree specified by the protograph of the ensemble.

In this case, $I_{E,C}^{j \to i}$ is the extrinsic mutual information between code bits associated with "type i" variable nodes (VNs) and the LLRs $L_{j \to i}$ send from "type j" check nodes (CNs) to these VNs. Then, because $I_{E,V}^{j \to i}$, one has (given an edge exists between CN j and VN i, i.e. given $b_{ji} \neq 0$)

$$I_{E,V}^{i \to j} = J\left(\sqrt{\sum_{c=1}^{M}(b_{ci} - \delta_{cj})(J^{-1}(I_{E,C}^{j \to i}))^2 + \sigma_{ch,i}^2}\right)$$

where $\delta_{cj} = 1$ when $c = 1$ and $\delta_{cj} = 0$ when $c \neq j$. $\sigma_{ch,i}^2$ can be set to zero if the code bit i is punctured.

Similarly, check node processing is $$I_{E,C}^{j \to i} = 1 - J\left(\sqrt{\sum_{v=1}^{N}(b_{jv} - \delta_{ci})(J^{-1}(1 - I_{E,V}^{v \to j}))^2}\right)$$

But instead repetition codes, an internal decoder of the GLDPC component code may be used, which function depends on the type of processing, and for two rows EXIT of turbo code may be used.

A priori knowledge, mutual information between transmitted systematic bit X, and the L-values A is $$I_A(\sigma_A) = 1 - \int_{-\infty}^{\infty} \frac{e^{-((\xi - \sigma_A/2)^2 / 2\sigma_A^2)}}{\sqrt{2\pi}\,\sigma_A} \cdot ld[1 + e^{-\xi}] d\xi.$$

which define $$J(\pi) := I_A(\sigma_A = \sigma)$$

as the function of mutual information with $$\lim_{\sigma \to 0} J(\sigma) = 0, \lim_{\sigma \to 1} J(\sigma) = 1,$$

$\sigma > 0$.

Under binary Additive White Gaussian Noise (AWGN) capacity, this may be given by $C = J(\sigma = 2/\sigma_n)$. The function J and the capacity cannot be expressed in closed form. This is why it is usually estimated using some approximation. For example, it may be approximated by a polynomial or lookup table. Because J monotonically increases in $\sigma=2/\sigma_n$, J is reversible:

$$\sigma_A = \mathcal{J}^{-1}(I_A)$$

In the same way, mutual information may be considered as a function of $I_A$ and the $E_b/N_0$(SNR) value:

$$I_E = \frac{1}{2} \sum_{x=1,-1} \int_{-\infty}^{\infty} p_e(\xi \mid X = x) \times ld \frac{2 \cdot p_E(\xi \mid X = x)}{p_E(\xi \mid X = -1) + p_E(\xi \mid X = 1)} d\xi, 0 \leq$$

$$I_E \leq 1$$

Multidimension EXIT Chart (Protograph EXIT-Chart, PEXIT) Method:

Input: Protograph P, level of error ε.

Output: Protograph threshold, value of $E_b/N_0$ for which BER (Bit Error Rate) less that ε.
1. Initialization. Select $E_b/N_0$ value. Initialize channel noise ($\sigma_{ch,0}, \ldots, \sigma_{ch,N-1}$) such that (cf. S. ten Brink, "Convergence behavior of iteratively decoded parallel concatenated codes," in IEEE TRANSACTIONS ON COMMUNICATIONS, vol. 49, no. 10, pp. 1727-1737, page 1732, equation 29):

$$\sigma_{ch,i} = 8R\left(\frac{E_b}{N_0}\right)_i$$

where $(E_b/N_0)_i$ equals zero when $x_i$ is punctured and equals the selected $E_b/N_0$ otherwise.
2. VN to CN. For all protograph $I_{E,V}^{i \to j}$ i=0, . . . , N−1 and j=0, . . . , M−1
3. CN to VN. For all protograph $I_{E,C}^{j \to i}$, i=0, . . . , N−1 and j=0, . . . , M−1
4. Regarding cumulative mutual information, compute (for i=0, . . . , N−1):

$$I_{CMI}^i = J\left(\sqrt{\sum_{c=1}^{M} \left(J^{-1}\left(I_{E,C}^{j \to i}\right)\right)^2 + \sigma_{ch,i}^2}\right)$$

5. If $I_{CMI}^i = 1$ (up to desire precision) for all i, then stop; otherwise, go to step 2.

For more details, see G Liva, S Song, L Lan, Y Zhang, S Lin, WE Ryan "*Design of LDPC codes: A survey and new results*" JOURNAL OF COMMUNICATION SOFTWARE AND SYSTEMS 2 (3), 191-211.

Labeling Code Candidates to Reach Required Girth and ACE(EMD) Values

Trapping Set as a Reason of Decoder Fail:

If considering some short length codes which shall be decoded by maximum likelihood (ML) decoder, only the codeword weigh spectrum may be improved.

For QC-LDPC codes of medium to long block lengths, the ML decoding may not be suitable because of the large number of codeword's involved. Instead, some sub-optimal iterative decoding algorithms like the sum product algorithm (SPA), min sum algorithm (MSA) may be used.

One significant assumption for which the SPA and MSA converges to the MAP decoding is that the states of all the check nodes (CN) connected to any specified variable node (VN) are independent given the value of the bit corresponding to the VN. Although this assumption holds asymptotically, it becomes invalid for finite-length codes after a certain number of iterations. The reason for this is the presence of cycles in the Tanner graph. In a Tanner graph of girth g, the independence assumption becomes invalid after m number of iterations where $$m < \frac{g}{4} < m + 1.$$

So, the girth of the Tanner graph should be increased in order to delay the violation of the independence assumption.

Further research has shown that cycles and their union form a special type of subgraph—Trapping set (TS), that become a reason of decoder failure under the AWGN-channel.

Figure 5:
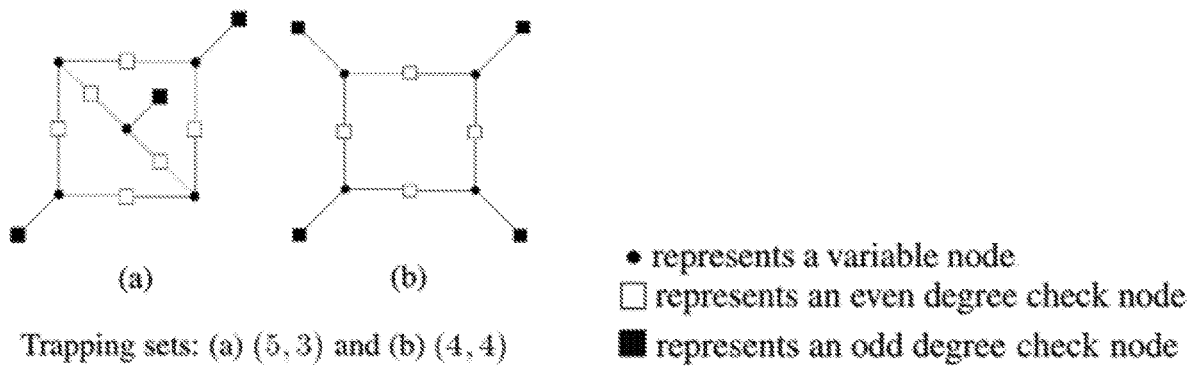
FIG. 5 shows examples of a TS produced by a union of cycles.

A trapping set, TS(a,b) is a sub-graph with a variable nodes and b odd degree check nodes. Hence, TS(a,0) is a codeword of weight a. Examples of a TS produced by a union of cycles (which include all variable nodes in a trapping set) are shown in FIG. 5.

For instance TS(5,3) is produced by three 8-cycles. TS(4, 4) shows the variable nodes involved in the 8-cycles. The existence of cycles of size g (girth g) in a Tanner graph produces TS(g/2, g/2) or they overlap. The overlap of TSs produces TS(a,b) with b/a<1 which is a more harmful. This is why some code design methods strive at maximizing the value of TS(a,b) threshold b/a. Indeed, if there is code with girth g, there is no TS(a,b): a+b<g This is provided by knowledge of TS structures where, for example, in girth 8 code, there is no TS(4,2), TS(3,3), or very harmful TS(5,1) and low weight codeword TS(4,0), which means that the minimal code distance is larger than 4 (cf. Vasid, B., Chilappagari, S. K., Nguyen, D. V., Planjery, S. K., "*Trapping set ontology*," COMMUNICATION, CONTROL, AND COMPUTING, 2009. ALLERTON 2009. 47TH ANNUAL ALLERTON CONFERENCE ON, vol., no., pp. 1,7, Sep. 30, 2009-Oct. 2, 2009. But it does not provide any detail about the existence of other types of harmful TS(b/a<1, error in a VNs provide error in b VNs) a+b≥g.

Figure 6:
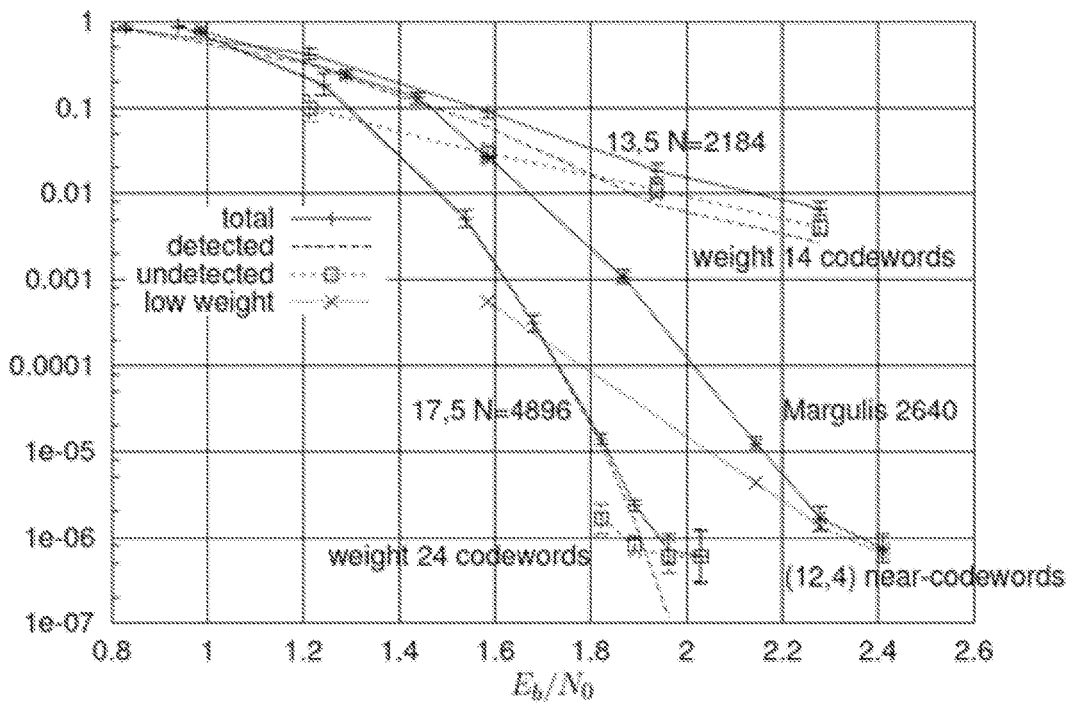
FIG. 6. depicts an error floor of a code due to a TS.

For example, considering Margulis code with girth 8 (cf. Tao Tian, Jones, C. R., Villasenor, J. D., Wesel, R. D., "*Selective avoidance of cycles in irregular LDPC code construction*," COMMUNICATIONS, IEEE TRANSACTIONS ON, vol. 52, no. 8, pp. 1242,1247, August 2004), it is known from the girth value that there is no codeword with weight 4, TS(4,0), and TSs with b<4, but that there exists harmful TS(12,4), due to which the error in 4 VNs provides for errors in 12 VNs. As a result, there is an error floor at FER 106, as shown in FIG. 6.

ACE Spectrum as Measure of Graph Connective Properties:

To measure the quality of QC-LDPC code from TS characteristics, an Extrinsic Message Degree (EMD) metric or its approximation, ACE, or the ACE spectrum may be used. The ACE spectrum is a spectrum of the approximate cycle EMD metric. The EMD of a cycle measures the level of connectively of the cycle with rest of the graph. In this regard, the following basic concepts about subgraph connective properties may be used.

For a given cycle C in a LDPC code graph $V_c$ may be the set of variable nodes in C and $C(V_c)$ may be the set of check node neighbors of $V_c$. The set $C(V_c)$ can be divided into three disjoint subsets:

$C^{cyc}(V_c)$: subset of $C(V_c)$ belonging to cycle C. Each node from $C^{cyc}(V_c)$ is at least doubly connected to the set $V_c$;

$C^{cut}(V_c)$: subset of $C(V_c)$ that are not in the cycle C, but are at least doubly connected to the set $V_c$;

$C^{ext}(V_c)$: subset of $C(V_c)$ singly connected to the set $V_c$.

For a given cycle C in the code graph and the corresponding set $V_c$, let $E(V_c)$ be the set of edges incident to $V_c$. The set $E(V_c)$ can be divided into three disjoint subsets:

$E^{cyc}(V_c)$: subset of cycle edges in $E(V_c)$ incident to check nodes in $C^{cyc}(V_c)$;

$E^{cut}(V_c)$: subset of cut edges in $E(V_c)$ incident to check nodes in $C^{cut}(V_c)$;

$E^{ext}(V_c)$: subset of extrinsic edges in $E(V_c)$ incident to check nodes in $C^{ext}(V_c)$.

The EMD of a given cycle C in the code graph, denoted EMD(C), is $EMD(C) = |E^{ext}(V_c)|$, where $|E^{ext}(V_c)|$ is the cardinality of $E^{ext}(V_c)$, the number of extrinsic edges of C.

If a given cycle in the code graph has low EMD, its communication with the rest of the graph is limited. This limits the amount of new knowledge about values of VNs in the cycle that could be collected from rest of the graph. In the extreme case, when the EMD of the cycle is zero, the VNs in the cycles are isolated from rest of the graph and the cycle becomes a low weight TS.

Determining the EMD of a cycle in a graph may be challenging, since it may take additional steps to determine if an edge is an extrinsic edge or a cut edge. If this difference is neglected and both, extrinsic and cut edges, are accounted for in the metric, a simplified version of the EMD metric may be used.

The ACE of a given cycle C in the code graph, denoted ACE(C) is $ACE(C) = |E^{ext}(V_c)| + |E^{cut}(V_c)|$. ACE(C) can be calculated as:

$$ACE(C) = \sum_{v \in E(V_c)} (d(v) - 2)$$

wherein d(v) is the degree of the variable node v.

G(H) may denote a code graph with n variable nodes and $d^{max}(v)$ may be its largest left degree with i being an even integer with $4 \leq i \leq 2d_{max}$. For each i, $\eta_{ACE}^i = (\eta_{ACE}^i(0), \ldots, \eta_{ACE}^i(k_i-1))$ may be the $k_i$-tuple of values where $\eta_{ACE}^i(i)$ is a number of VNs with a property that the smallest ACE value of the cycle of length i they belong to is equal to i with $0 \leq i \leq (k_i-1) = (0.5)*(d_v^{max}-2)$. The ACE spectrum of G(H), $ACE(G(H)) = (\eta_{ACE}^4, \ldots, \eta_{ACE}^{2d\;max})$ is the $(d_v^{max}-2)$-tuple of $n_{ACE}^i$ $k_i$-tuples with $4 \leq i \leq 2d_{max}$.

Figure 7:
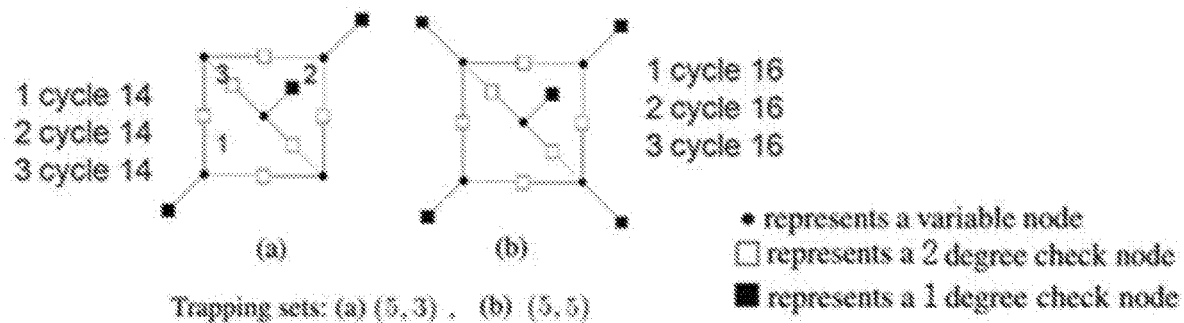
FIG. 7 illustrates an influence of increasing the ACE which prevents harmful TS.

For example, FIG. 7 shows the influence of increasing the ACE to prevent harmful TS. Hence, if the ACE metric is used as a measure of TSs, harmful TSs may be avoided. To improve the usability of this approach, it may be beneficial to define sufficient parameters for which the ACE spectrum becomes (approximately) equal to the EMD spectrum of QC-LDPC codes.

Condition for which the ACE Spectrum becomes a TS enumerator:

In Deka, Kuntal, Rajesh, A., Bora, P. K., "*On the equivalence of the ACE and the EMD of a cycle for the ACE spectrum constrained LDPC codes,*" TURBO CODES AND ITERATIVE INFORMATION PROCESSING (ISTC), 2014 8TH INTERNATIONAL SYMPOSIUM ON, vol., no., pp. 67,71, 18-22 Aug. 2014, a sufficient condition for the equality EMD=ACE is shown: For an LDPC code with girth g, any cycle $C_{2i}$ of length 2i has equal ACE and EMD if $i < g-2$.

For example, for a QC-LDPC code of girth 10, all cycles of length $<2*(10-2)=16$: 10, 12 and 14 have equal respective ACE and EMD. This leads to two strong consequences, for any cycle with equal ACE and EMD:

1. CNs connected to the VNs in the cycle but not involved in the cycle will be singly connected to the cycle. The reliability of the messages coming from these CNs can be increased relative to messages coming from the CNs involved in the cycle in order to enhance the benefit of the messages coming from the rest of the Tanner graph. In this way, better connectivity can be ensured for the isolated small cycles and the performance of the iterative decoders can be improved (gain in waterfall region).

2. TS enumerators can be obtained via the ACE spectrum. This is because a cycle of length l contains l/2 number of VNs. For an ACE value $\eta$, the subgraph induced by the l/2 number of VNs constrains exactly $\eta$ odd-degree CNs. Hence, the cycle can be treated as TS(l/2, $\eta$), (error-floor region improvement).

Lifting the Protomatrix:

The lifting may be based on a simulated annealing optimization algorithm. The algorithm may take as input a protograph P, a circulant size Z, a value g indicating a desired girth and an ACE or EMD value. The algorithm may output a parity-check matrix H(P) lifted for the circulant size Z.

An initial parity check matrix may be generated by choosing random shift values, i.e., the choosing is not restricted as to the desired girth (cf. M. P. C. Fossorier, "*Quasi-cyclic low-density parity-check codes from circulant permutation matrices*", IEEE TRANS. INF. THEORY, vol. 50, pp. 1788-1794, August 2004). A set of allowed shift values for the desired girth may then be calculated as follows: A cycle of length 2i in the parity-check matrix $H(P) = [h_{x,y}]$ may be defined by 2i position $h_{x,y}=1$ such that:

1. Two consecutive positions are obtained by changing alternatively row or column only; and
2. All positions are distinct, except the first and last ones.
   It follows that two consecutive positions in any cycle belong to distinct circulant permutation matrices which are either in the same row, or in the same column. Hence, a cycle of length 2i may be associated with an ordered series of circulant permutation matrices (CPM) $A_{j_0,l_0}, A_{j_1,l_0}, A_{j_1,l_1}, \ldots, A_{j_{i-1},l_{i-1}}, A_{j_0,l_{i-1}}, A_{j_0,l_0}$ with $1 \leq k \leq i$, $j_k \neq j_{k-1}$ and $l_k \neq l_{k-1}$. With the convention of going from $A_{j_{k-1},l_{k-1}}$ to $A_{j_k,l_k}$ via $A_{j_k,l_{k-1}}$ (i.e. changing first of row and then of column), any cycles of length 2i in H can be represented by $(j_0, l_0); (j_1, l_0); \ldots (j_{i-1}, l_{i-1}); (j_0,l_0)$ for $1 \leq k \leq i$, $j_k \neq j_{k-1}$ and $l_k \neq l_{k-1}$.

With $\Delta_{j_x,j_y}(l) = A_{j_x,l} - A_{j_y,l}$, the matrix H contains a cycle of length 2i only if $$\sum_{k=0}^{i-1} \Delta_{j_k,j_{k+1}}(l_k) = 0 \bmod Z$$

with $j_0 \neq j_i$, $j_k \neq j_{k+1}$ and $l_k \neq l_{k-1}$.

A necessary and sufficient condition for the Tanner graph representation of the matrix H(P) to have a girth of at least 2(i+1) is $$\sum_{k=0}^{m-1} \Delta_{j_k,j_{k+1}}(l_k) = 0 \bmod Z$$

for all m, $2 \leq m \leq i$, all $j_k$, $0 \leq j_k \leq m-1$, all $j_{k+1}$, $0 \leq j_{k+1} \leq m-1$, and all $1 \leq l_k \leq n$ with $j_0 = j_m$, $j_k \neq j_{k+1}$ and $l_k \neq l_{k+1}$.

Figure 8:
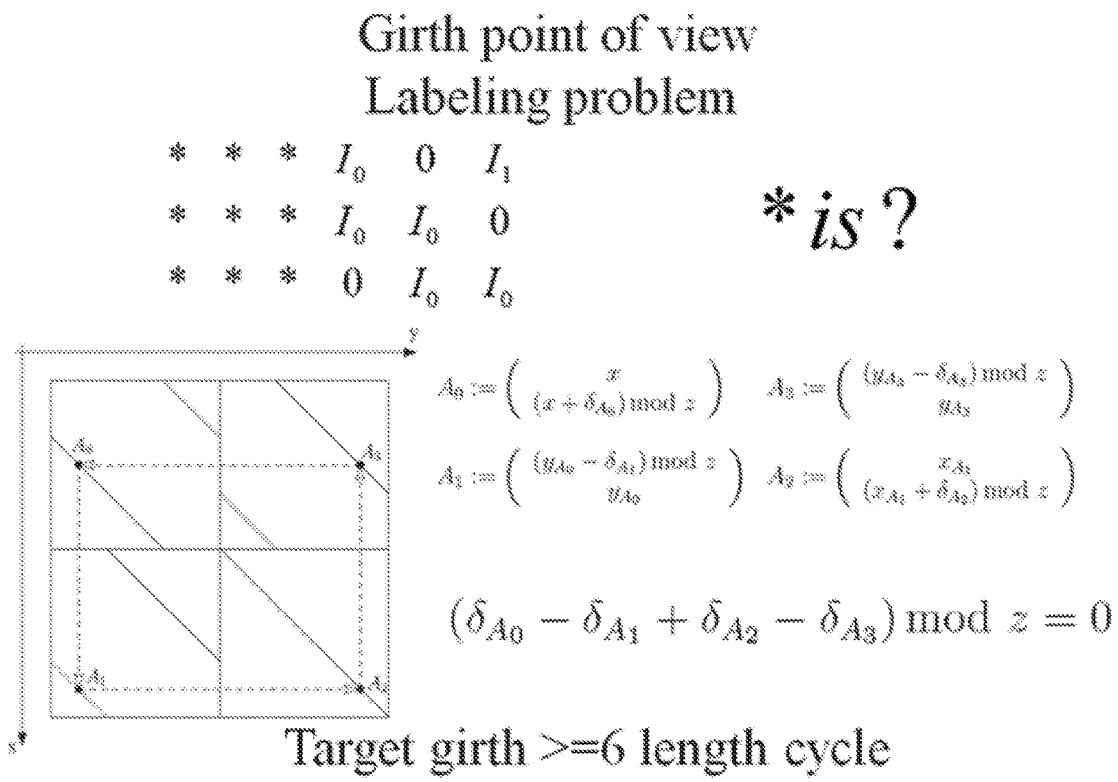

FIGS. 8 and 9 illustrate the usage of this equation for labeling a protomatrix of size 3×6, wherein the desired girth is above 4. If the desired girth is reached, it may be tried to improve its connective properties. Otherwise, the algorithm may be started anew (or backtracking may be used to choose another shift value).

For improving the connective properties, a temperature parameter with relatively high value may be chosen to ensure reaching a global optimum of cycle topology properties (EMD or ACE) and the connective properties of the labelled protomatrix (QC-LDPC matrix) may be iteratively improved by repeating the following procedure:
1) Nstep=0
2) Choosing a random non-empty cell of the protomatrix.
3) Enumerating all possible cycles through this cell of length shorter than g.
4) Calculating a number of existing cycles for all possible shift values of this circulant.
5) Randomly taking one of these values with a probability depending on the value of cycles and the temperature parameter. The probability weight function may be greater for smaller values of ShiftCycles(m) and a difference increase with the decrease of the temperature. An example of such a probability weight function is w(m)=

$$w(m) = e^{\frac{-ShiftCycles(m)}{Temperature}}.$$

The exact probability of the choice m may be $p(m) = w(m) / \Sigma_{i=0}^{N-1} w(i)$.

6) Decreasing the value of the temperature. Each step, the temperature should monotonically decrease. An example of a formula for decreasing the temperature is $$Temperature = Const \frac{\text{Total number of cycles in protograph}}{Nstep^2}$$

7) Incrementing Nstep and going to step 2.
8) If the result is stable for a long time, the algorithm may end.

Simulating Code Candidates and Choosing a Code Candidate

The simulation may include choosing a frame error rate (FER) level and starting iterations of the belief propagation algorithm to find a smallest possible $$\frac{E_b}{N_0}$$

satisfying the FER. From different code candidates, the one that achieves the lowest $$\frac{E_b}{N_0}$$

may be chosen. By continuing with adding rows and columns to the protomatrix and applying this method, a lifted family of nested QC-LDPC codes may be generated.

Figure 10:
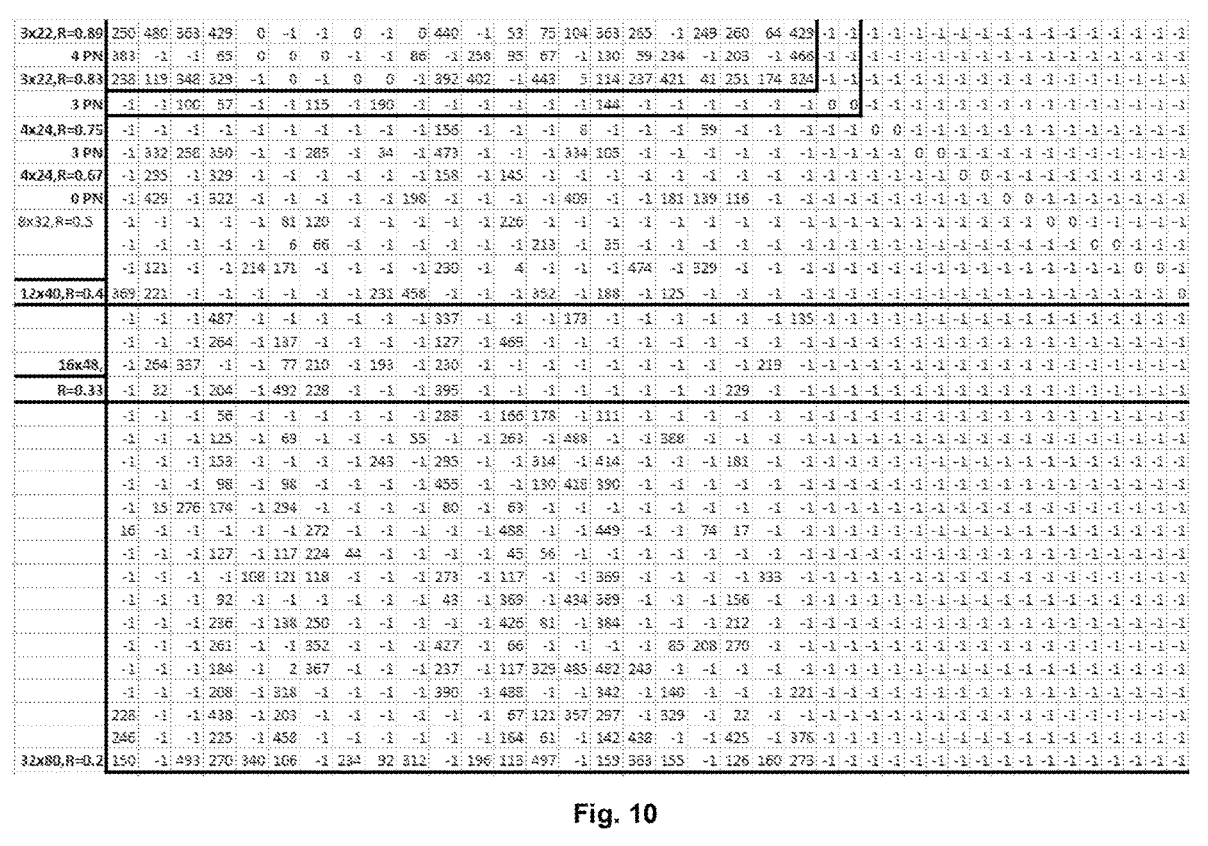

An example of the optimization result is shown in FIG. 10.

By replacing the rows in the QC-LDPC matrix with a component code, a family of nested GLDPC codes can be generated. For example, a Cordaro-Wagner component code may be used. A Cordaro-Wagner component code is a 2-dimensional repetition code over GF(2) of length n, having the largest possible minimum weight:

$$H_{component\_code} = \begin{bmatrix} 1 & 1 & \ldots & 1 & 1 & 1 & \ldots & 1 & 0 & 0 & \ldots & 0 \\ 1 & 1 & \ldots & 1 & 0 & 0 & \ldots & 0 & 1 & 1 & \ldots & 1 \\ & \underbrace{\phantom{xxxx}}_{l} & & & \underbrace{\phantom{xxxx}}_{m} & & & \underbrace{\phantom{xxxx}}_{n} & \end{bmatrix}$$

This may minimize the GLDPC complexity overhead and improve the resulting performance. For constructing the parity-check matrix of the generalized QC-LDPC code, $H_{GLDPC}$, from the permutation parity-check matrix $H_\pi$, each row of the matrix $$H_\pi = \begin{pmatrix} 1 & 0 & 1 & 0 & 0 & 0 & 1 & 0 & 1 \\ 0 & 1 & 0 & 1 & 1 & 0 & 0 & 1 & 0 \\ 1 & 1 & 1 & 1 & 0 & 1 & 1 & 0 & 1 \end{pmatrix}$$

may be replaced with a component code $$H_{component\_code} = \begin{pmatrix} 1 & 0 & 1 & & 1 & 0 \\ & & & \ldots & & \\ 0 & 1 & 1 & & 0 & 1 \end{pmatrix};$$

Which results in the GLDPC code:

$$H_{GLDPC} = \begin{pmatrix} 1 & 0 & 0 & 0 & 0 & 0 & 1 & 0 & 1 \\ 0 & 0 & 1 & 0 & 0 & 0 & 1 & 0 & 0 \\ 0 & 1 & 0 & 0 & 1 & 0 & 0 & 1 & 0 \\ 0 & 0 & 0 & 1 & 1 & 0 & 0 & 0 & 0 \\ 1 & 0 & 1 & 1 & 0 & 0 & 1 & 0 & 1 \\ 0 & 1 & 1 & 0 & 0 & 1 & 1 & 0 & 0 \end{pmatrix}$$

The GLDPC code parity-check matrix may be used for implementing an IR-HARQ scheme by dividing the parity-check matrix as shown in FIG. 3, where A is the information part of the core matrix, B is the parity part of the core matrix, D is the parity-check matrix for a lower rate.

1. HARQ Protocol

A HARQ protocol may govern a set of $K \geq 2$ transmissions. If denoting the number of columns of the protomatrix $P_i$ by $n_i$ with $n_1 = n$, $n_{i+1} > n_i$, then, for the case of incremental redundancy (IR), $n_i = i \cdot n$. If z is the circulant size and the information bits with attached CRC are denoted by u, u may be encoded using the GLDPC code $H(P_1)$ to generate the codeword $c_1$ of length $n_1 \cdot z$. After modulation of the codeword, the codeword may be passed through the channel. After demodulation of the received signal, the soft information $L_1$ consisting of LLR's corresponding to bits of $c_1$ is provided. Using the parity-check matrix $H(P_1)$, $L_1$ may be decoded. After decoding, the CRC may be checked. If the information is confirmed, it may be assumed that the correct information bits have been decoded.

Otherwise, the transmission with number iter=2 may be requested. Heretofore, the protograph $P_{iter}$ may be constructed and u may be encoded using the GLDPC code $H(P_{iter})$ to get the codeword $c_z$ of length $n_{iter} \cdot z$. Since $c_{iter}$ contains $c_{iter-1}$ as a subword only the remaining part of $c_{iter}$ may be transmitted, i.e., only n bits $c_{iter}\backslash c_{iter-1}$ may be transmitted. After modulation of the sent bits, passing through the channel, demodulation of the received signal, the soft information $L'_{iter}$ consisting of LLR's corresponding to bits of $c_{iter}\backslash c_{iter-1}$ is available at the decoder. The soft information $L_{iter-1}$ and $L'_{iter}$ may then be combined into $L_{iter}$ (e.g., by concatenation into a vector of length $n_{iter} \cdot z$). Using the parity-check matrix $H(P_2)$ $L_{iter}$ may be decoded. After decoding, the CRC may be checked. If the information is confirmed, it may be assumed that the correct information bits have been decoded. Otherwise, if iter<K the second step may be repeated with iter=iter+1.

What is claimed is:

1. An encoder for forward error correction channel encoding, the encoder comprising:
   a processor; and
   a non-transitory computer readable medium coupled to the processor for storing processor-executable program instructions that, when executed by the processor, cause the encoder to:
   determine a protomatrix of a low-density parity check (LDPC) code for a hybrid automatic repeat request (HARQ) scheme, the protomatrix being representable by a sub-matrix formed by intersecting first rows and first columns, and second rows and second columns, wherein a number of the second columns is two times a number of the second rows;
   lift the protomatrix to determine a parity check matrix of a quasi-cyclic (QC)-LDPC code;
   replace rows of the parity check matrix with row pairs of a Cordaro-Wagner component code to derive a generalized QC-LDPC code;
   provide a codeword having data bits and parity bits, based on data bits and rows and columns of the generalized QC-LDPC code corresponding to the first rows and first columns; and
   provide additional parity bits, based on the codeword, and at least one of the rows and columns of the generalized QC-LDPC code.

2. The encoder of claim 1, wherein a matrix formed by an intersection of rows and columns of a parity check matrix of the generalized QC-LDPC code, which correspond to the second rows and columns, has a triangular structure.

3. The encoder of claim 1, wherein the lifting the protomatrix to determine the parity check matrix of the QC-LDPC code, comprises:
   determine multiple possible shift values for entries of a base matrix of the QC-LDPC code, wherein the entries correspond to edges of a protograph corresponding to the protomatrix; and
   iteratively select shift values for the entries, wherein a selection probability of a shift value is based on a measure of girth of the QC-LDPC code.

4. The encoder of claim 3, wherein the selection probability of a shift value that results in a larger girth than another shift value, is iteratively decreased.

5. The encoder of claim 4, wherein a selection probability of a shift value of multiple shift values achieving a same girth is to be larger, when the shift value achieves a higher extrinsic message degree (EMD), or a higher approximated cycle EMD (ACE), of a smallest cycle generated by the shift value.

6. The encoder of claim 1, wherein the encoder is further configured to:
   repeat the determining and the lifting for multiple protomatrices that differ with respect to the second rows and columns; and
   lift the protomatrix to determine the parity check matrix of the QC-LDPC code by selecting the protomatrix of the multiple protomatrices based on a performance measure.

7. A decoder for forward error correction channel decoding, the decoder comprising:
   a processor; and
   a non-transitory computer readable medium coupled to the processor for storing processor-executable program instructions that, when executed by the processor, cause the decoder to:
   receive data including reliability values of a bit sequence of data bits and parity bits, wherein the bit sequence represents a codeword of a codebook;
   decode the data bits by passing messages between Cordaro-Wagner component code decoding units, wherein the messages are based on the reliability values and the passing is governed by subrows and subcolumns of a protomatrix of a low-density parity check (LDPC) code for a hybrid automatic repeat request (HARQ) scheme, the protomatrix being represented by the subrows and subcolumns and second rows and second columns, wherein a number of the second columns is two times a number of the second rows;
   transmit a HARQ message in relation to the codeword, when the decoder determines that one or more data bits have not been decoded correctly, wherein the HARQ message is to demand a provision of additional parity bits for the data bits;
   receive further data including further reliability values of a bit sequence comprising the additional parity bits; and
   decode the one or more data bits that have not been decoded correctly by passing further messages between the Cordaro-Wagner component code decoding units, wherein the further messages are based, at least in part, on the further reliability values, and the passing of the further messages is governed by the subrows and the subcolumns of the protomatrix and one or more of the second rows and/or columns.

8. The decoder of claim 7, wherein a decoding unit is further configured to operate on two parity check equations.

9. A non-transitory machine readable storage medium having stored thereon processor executable instructions which, when executed by a processor, cause the processor facilitate execution of a method of forward error correction channel encoding, the method comprising:
   determining a protomatrix of a low-density parity check (LDPC) code for a hybrid automatic repeat request (HARQ) scheme, the protomatrix being representable by a sub-matrix formed by intersecting first rows and first columns, and second rows and second columns, wherein a number of the second columns is two times a number of the second rows;
   lifting the protomatrix to determine a parity check matrix of a quasi-cyclic (QC)-LDPC code;
   replacing rows of the parity check matrix with row pairs of a Cordaro-Wagner component code to derive a generalized QC-LDPC code;
   providing a codeword having data bits and parity bits, based on data bits and rows and columns of the generalized QC-LDPC code corresponding to the first rows and first columns; and providing additional parity bits based on the codeword and at least one of the rows and columns of the generalized QC-LDPC code.

10. The non-transitory machine readable storage medium of claim 9, wherein a matrix formed by an intersection of rows and columns of a parity check matrix of the generalized QC-LDPC code, which correspond to the second rows and columns, has a triangular structure.

11. The non-transitory machine readable storage medium of claim 10, wherein lifting the protomatrix to determine the parity check matrix of the QC-LDPC code comprises:

determining multiple possible shift values for entries of a base matrix of the QC-LDPC code, wherein the entries correspond to edges of a protograph corresponding to the protomatrix; and iteratively selecting shift values for the entries, wherein a selection probability of a shift value is calculated based on a measure of girth of the QC-LDPC code.

12. The non-transitory machine readable storage medium of claim 9, wherein:

the determining and the lifting are repeated for multiple protomatrices that differ with respect to the second rows and columns; and the lifting the protomatrix to determine the parity check matrix of the QC-LDPC code comprises selecting the protomatrix of the multiple protomatrices based on a performance measure.

* * * * *